United States Patent
Tang et al.

(10) Patent No.: US 7,535,253 B1
(45) Date of Patent: May 19, 2009

(54) REGISTER DATA RETENTION SYSTEMS AND METHODS DURING REPROGRAMMING OF PROGRAMMABLE LOGIC DEVICES

(75) Inventors: Howard Tang, San Jose, CA (US); Roger Spinti, Milpitas, CA (US); San-Ta Kow, San Jose, CA (US); Ju Shen, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 77 days.

(21) Appl. No.: 11/941,006

(22) Filed: Nov. 15, 2007

(51) Int. Cl.
*G06F 7/38* (2006.01)
*H03K 19/173* (2006.01)

(52) U.S. Cl. .............................. 326/38; 326/40; 326/41

(58) Field of Classification Search ............. 326/38–41, 326/47
See application file for complete search history.

(56) References Cited

U.S. PATENT DOCUMENTS

| 5,548,228 | A | 8/1996 | Madurawe |
| 5,844,422 | A | 12/1998 | Trimberger et al. |
| 6,507,211 | B1 | 1/2003 | Schultz et al. |
| 6,525,562 | B1 | 2/2003 | Schultz et al. |
| 7,215,139 | B2 | 5/2007 | Agrawal et al. |
| 7,459,931 | B1 * | 12/2008 | Tang et al. ..................... 326/38 |

* cited by examiner

*Primary Examiner*—Anh Q Tran
(74) *Attorney, Agent, or Firm*—Haynes and Boone, LLP

(57) ABSTRACT

Systems and methods provide register data retention techniques for a programmable logic device in accordance with one or more embodiments of the present invention. For example, in accordance with an embodiment, a method includes programming routing resources between programmable logic and registers of a programmable logic device to provide a data path for data prior to a reprogramming; transferring data from the programmable logic, prior to the reprogramming, to the registers via the data path to store the data within the programmable logic device during the reprogramming; reprogramming the programmable logic device, wherein the reprogramming provides a reprogrammed data path between the programmable logic and the registers of the programmable logic device; and transferring the data within the programmable logic device from the registers via the reprogrammed data path for use by the programmable logic after the reprogramming of the programmable logic device has been completed.

20 Claims, 2 Drawing Sheets

REGISTER DATA RETENTION SYSTEMS AND METHODS DURING REPROGRAMMING OF PROGRAMMABLE LOGIC DEVICES

TECHNICAL FIELD

The present invention relates generally to electrical circuits and, more particularly, to data retention, such as for example for reprogramming of a programmable logic device.

BACKGROUND

A programmable logic device (PLD, e.g., a field programmable gate array (FPGA) or a complex programmable logic device (CPLD)) may be used in a variety of applications and may provide certain advantages over other types of devices. For example, a PLD offers the advantage of being reprogrammable in the field (e.g., a field update, with the PLD in its operational environment).

A drawback of a conventional PLD is that, while its configuration memory is being reprogrammed, the PLD typically cannot preserve data stored in its volatile memory (e.g., volatile embedded random access memory (RAM) blocks or registers) and, consequently, the data is lost during the reprogramming process (e.g., registers are reset with a global reset signal). However, depending upon the particular application, a user of the PLD may prefer to preserve the data stored in the volatile memory for use within the PLD after the reprogramming (e.g., reconfiguration) of the PLD has been completed and the PLD is operating based upon the new configuration data provided during the reprogramming (e.g., a user mode of operation).

A conventional approach to preserve the data stored in volatile memory during the reprogramming process, for example, is to read from the PLD the data that a user desires to preserve and merge this data with the new configuration data prior to the reprogramming process. However, this process is time consuming and complex and may be difficult to achieve for some types of applications.

As a result, there is a need for improved reprogramming techniques for PLDs.

SUMMARY

In accordance with one embodiment of the present invention, a programmable logic device includes a plurality of logic blocks; a plurality of registers; routing resources adapted to provide a programmable data path between the logic blocks and the registers; configuration memory adapted to store configuration data for configuration of the logic blocks and the routing resources of the programmable logic device; and a logic circuit adapted to control a transfer of data from the logic blocks to the registers via the routing resources to maintain the data transferred to the registers during a reprogramming operation of the programmable logic device.

In accordance with another embodiment of the present invention, a method includes programming routing resources between programmable logic and registers of a programmable logic device to provide a data path for data prior to a reprogramming; transferring data from the programmable logic, prior to the reprogramming, to the registers via the data path to store the data within the programmable logic device during the reprogramming; reprogramming the programmable logic device, wherein the reprogramming provides a reprogrammed data path between the programmable logic and the registers of the programmable logic device; and transferring the data within the programmable logic device from the registers via the reprogrammed data path for use by the programmable logic after the reprogramming of the programmable logic device has been completed.

In accordance with another embodiment of the present invention, a computer-readable medium on which is stored a computer program for performing a method, the method includes generating configuration data for programming a programmable logic device; setting a first bit of the configuration data, a value of the first bit providing a latch enable signal to control whether data will be transferred during a reprogramming operation of the programmable logic device to registers within the programmable logic device to maintain the data during the reprogramming operation; and setting a second set of bits of the configuration data to provide a data path using routing resources between the registers and user logic within the programmable logic device after the reprogramming operation.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
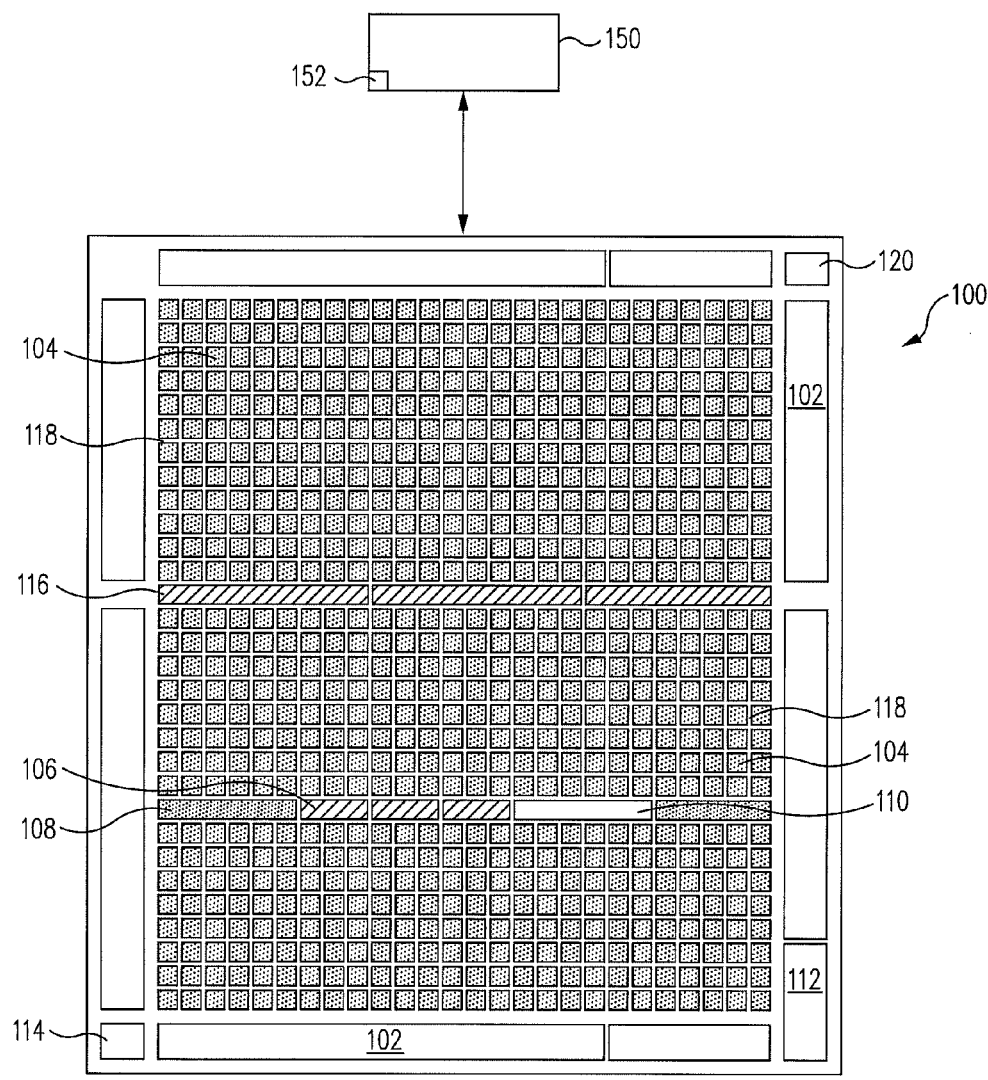
FIG. 1 shows a block diagram illustrating an example of a programmable logic device system in accordance with an embodiment of the present invention.

FIG. 1 shows a block diagram illustrating a programmable logic device (PLD) 100 in accordance with an embodiment of the present invention. PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., supports one or more I/O and/or memory interface standards) for PLD 100, while programmable logic blocks 104 provide logic functionality (e.g., LUT-based logic or logic gate array-based logic) for PLD 100. PLD 100 also includes registers 120, which are specific registers for storing desired data during a reprogramming of PLD 100, as discussed further herein in accordance with one or more embodiments of the present invention.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support, such as dual boot support, and/or error detection), a configuration port 112, configuration memory 114, special function blocks 116 (e.g., DSP blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

In general, it should be understood that the number and placement of the various elements, such as I/O blocks 102, logic blocks 104, memory 106, clock-related circuitry 108, configuration logic 110, configuration port 112, configuration memory 114, special function blocks 116, routing resources 118, and registers 120, are not limiting and may depend upon the desired application. For example, special function blocks 116 are optional and various other elements of PLD 100 may not be required or may be of a simplified version or related type of circuit based upon the desired application or design specification (e.g., for the type of programmable device selected), as would be understood by one skilled in the art.

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). As another example, registers 120 may be implemented as a block of circuitry or may be distributed within PLD 100, such as within and/or near logic blocks 104 or throughout the programmable circuitry (e.g., user logic). It should also be understood that the various embodiments of the present invention as disclosed herein are not limited to programmable logic devices, such as PLD 100, and may be applied to various other types of programmable devices, as would be understood by one skilled in the art.

In accordance with one or more embodiments of the present invention, registers 120 are used and controlled to store information within PLD 100 during a reprogramming operation (e.g., partial or complete reconfiguration of PLD 100). For example, FIG. 2 shows a block diagram illustrating a circuit 200, which is an example of implementation details for register data retention using registers 120, such as within PLD 100 of FIG. 1 in accordance with an embodiment of the present invention.

Circuit 200 includes latches 204, which are separately referenced as latches 204(1) through 204(n), where "n" may represent any desired number. For this specific example, there are sixteen latches 204 (i.e., latches 204(1) through 204(16)), which may represent registers 120 (FIG. 1). In general, registers 120 may be implemented as any type of register or latch (e.g., latch 204 to provide persistent user storage or persistent user registers), as would be understood by one skilled in the art.

Figure 2:
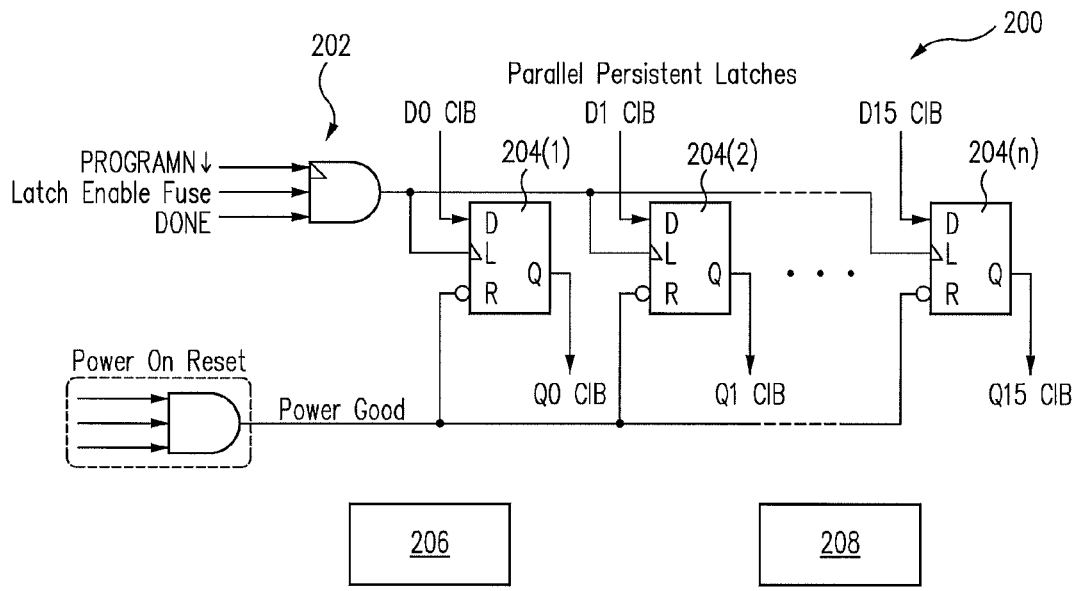
FIG. 2 shows a block diagram illustrating an example of implementation details for register data retention, such as within the programmable logic device of FIG. 1 in accordance with an embodiment of the present invention.

As illustrated in FIG. 2, latches 204 are controlled by logic 202, which may represent any type of logic for controlling latches 204 to store desired data prior to a reprogramming operation of PLD 100 and to provide the data within PLD 100 for use after the reprogramming operation. For example, logic 202 may represent logic gates (e.g., AND gates as shown) for receiving various control signals to control operation of latches 204, such as for receiving data signals (labeled D0 through D15) to store prior to reprogramming and providing data signals (labeled Q0 through Q15) after the reprogramming. The data signals (D0-D15, Q0-Q15) may be provided in a parallel fashion as shown or may be provided in a serial fashion, as would be understood by one skilled in the art.

Furthermore, the data signals (D0-D15, Q0-Q15) may be provided to and from circuit 200, for example, via a common interface block (CIB) 206, which may form part of interface or interconnect circuitry (e.g., routing resources 118) within PLD 100. Thus for example, the data signals (D0-D15, Q0-Q15) may be provided to and from user logic 208 (e.g., representing logic blocks 104, memory 106, or other circuit elements within PLD 100) via CIB 206.

It should be understood that the control signals for this specific example are not limiting and that the type and number of control signals may be modified, depending upon the specific implementation, application, and/or PLD, as would be understood by one skilled in the art. For this specific example, logic 202 receives a PROGRAMN signal, a latch enable (LE) fuse signal, a DONE signal, and a reset (power on reset) signal. The reset signal may be controlled (e.g., via logic 202 or by signal application logic) to reset latches 204, but in general the reset signal would not be applied to latches 204 during reprogramming of PLD 100 if it is desired for latches 204 to store information during the reprogramming operation (e.g., latches 204 would not receive a global reset signal during reprogramming).

The PROGRAMN signal may be provided to PLD 100 (e.g., by a user via an external device) to command a reprogramming operation of PLD 100. For this example as shown, a reprogramming operation of PLD 100 may be initiated by driving the PROGRAMN signal to a logical low level. The DONE signal (e.g., an internal signal) may be driven to a logical low level to maintain the information in latches 204 and may be driven to a logical high level once reprogramming (e.g., configuration) has been completed to allow the information to be transferred from latches 204 to the desired circuits (e.g., user internal logic fabric (PLD fabric) within PLD 100, such as logic blocks 104 or other circuit elements within user logic 208). The latch enable (LE) fuse signal may be provided to indicate whether a user desires to capture and preserve information during a reprogramming operation of PLD 100.

As a specific example, Table 1 summarizes various register (e.g., latches 204, also referred to as persistent user latches or persistent user registers) and signal behavior and Table 2 summarizes further details of various signals in accordance with an embodiment of the present invention. An INITN signal is included in Table 1, with this signal representing, for example, an output signal from PLD 100 to provide reprogramming (e.g., reconfiguration) status to an external device and to clear/reset various circuitry for the reconfiguration of PLD 100.

In general as an example, latches 204 allow a user of PLD 100 to store desired information prior to reprogramming (e.g., before toggling the PROGRAMN signal pin to reconfigure PLD 100). During the reconfiguration, the content in latches 204 (e.g., the persistent user registers) is kept intact. After reprogramming (e.g., configuration or reconfiguration) of PLD 100, the content in latches 204 is available for a user to use (e.g., the content is transferred to the user fabric (user logic 208, also referred to as internal fabric, programmable logic, or PLD fabric)).

TABLE 1

| User | Device |
| --- | --- |
| Drive PROGRAMN Pin Low | If the Latch Enable Fuse and DONE signals are high, capture the CIB input into the registers Drive the DONE signal low to keep the content in the register Drive INITN signal low to start the Clear All Drive INITN signal high when Clear All complete |
| Drive PROGRAMN Pin High | Drive the INITN signal to the INITN pin Configuration starts then completes Drive DONE signal to high to enter user mode |

TABLE 2

| Signal | Type | Description | Function |
| --- | --- | --- | --- |
| D0-D15 | CIB Input | Parallel Data In | Provide parallel data from the PLD fabric to the latch |
| Q0-Q15 | CIB Output | Parallel Data Out | Provide parallel data to the PLD fabric from the latch |
| PROGRAMN | Control Signal | High to Low Edge on PROGRAMN pin | Latch in the data from D[0:15] |
| DONE | Internal Signal | DONE Signal | Prohibit multiple latching due to transitional glitches on the PROGRAMN pin |
| Latch Enable | Fuse | Enable the latch action | Allow users a choice as to whether to use the persistent latches |

Figure 3:
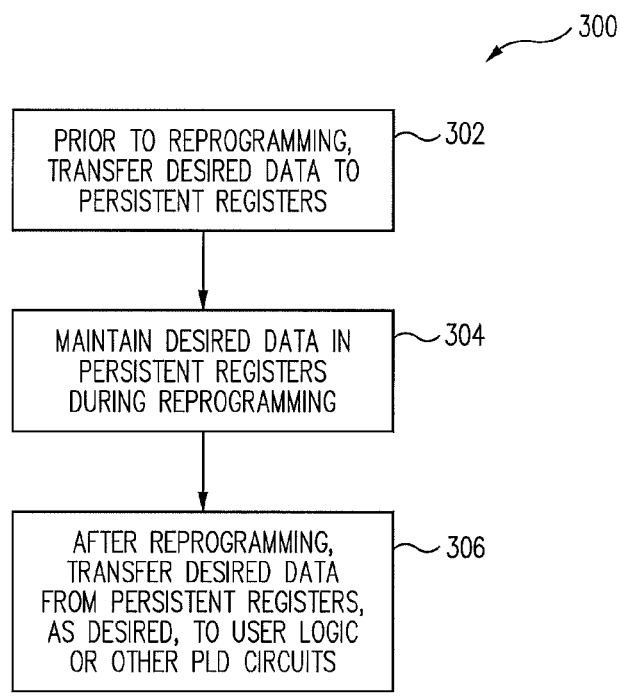
FIG. 3 shows a flowchart illustrating an example of register data retention operations for the programmable logic device of FIG. 1 in accordance with an embodiment of the present invention.

FIG. 3 shows a flowchart 300 illustrating an example of general register data retention operations for a programmable logic device (e.g., PLD 100 of FIG. 1) in accordance with an embodiment of the present invention. Specifically, prior to reprogramming (block 302), information within the PLD that is desired to be retained through the reprogramming operation is transferred to persistent registers (e.g., registers 120, such as latches 204) via programmed data paths. This information (e.g., which may include data from lookup tables or registers within the logic blocks, from memory blocks, or data from data lines or other circuit elements within the PLD fabric) is then maintained in the persistent registers during the reprogramming operation (block 304), such as discussed for example in reference to FIG. 2. After reprogramming the PLD, the information may be transferred (e.g., via newly programmed data paths) from the persistent registers for use within the PLD, as desired for a specific requirement or application (block 306). Note that this transfer process may occur after the reprogramming operation has been completed and a user mode of operation has begun or, alternatively, this transfer process may occur as a later stage of the reprogramming process (e.g., at a point when the information may be transferred out of the persistent registers and maintained within the PLD after the reprogramming operation has been completed for use during the user mode of operation).

As discussed previously (e.g., in reference to FIG. 2), the PLD may be programmed to retain information within the persistent registers during a subsequent reprogramming operation of the PLD (e.g., by setting a latch enable fuse, such as a configuration memory cell of configuration memory 114)). The PLD, which includes the persistent registers, may be initially programmed, for example, by a user via a PLD design tool (e.g., a software design tool such as a computer program stored on a computer-readable medium for execution by a computer), which may be used during the PLD design process to generate configuration data and program the PLD, as would be understood by one skilled in the art.

For example in accordance with an embodiment and referring generally to FIGS. 1-3, a device 150 (e.g., a computer as shown in FIG. 1) may be used to run PLD design tool software stored in memory 152 (FIG. 1) to perform the PLD design process and to generate configuration data and program the PLD according to the techniques disclosed herein, as would be understood by one skilled in the art. Memory 152 may be a permanent memory (e.g., a fixed hard drive) within device 150 or may represent portable memory (e.g., portable hard drive, compact disk, flash memory, or other type of memory) capable of storing the PLD design tool software and couplable to device 150 to allow access to its information. The PLD design tool software would incorporate the techniques disclosed herein, as would be understood by one skilled in the art, to permit a user to set the latch enable fuse, generate the desired internal signals (e.g., the DONE signal), and provide routing resources (e.g., via routing resources 118) between the user logic (e.g., user logic 208) and the persistent registers (e.g., latches 204) via the CIBs (e.g., CIBs 206) or other programmable routing resources.

Systems and methods are disclosed herein to provide register data retention techniques for a programmable logic device in accordance with one or more embodiments of the present invention. For example, in accordance with an embodiment of the present invention, a method of maintaining data during a field update of the PLD is disclosed, with the PLD having persistent user registers that may be used to store data from one reprogramming operation (e.g., partial or complete configuration or reconfiguration) to the next. For example in accordance with an embodiment, the PLD, with the persistent user registers, allows a user to retain desired information through a reprogramming operation so that the information stored within the PLD prior to the reprogramming operation is maintained and is available after the reprogramming operation.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A programmable logic device comprising:
   a plurality of logic blocks;
   a plurality of registers;
   routing resources adapted to provide a programmable data path between the logic blocks and the registers;
   configuration memory adapted to store configuration data for configuration of the logic blocks and the routing resources of the programmable logic device; and
   a logic circuit adapted to control a transfer of data from the logic blocks to the registers via the routing resources to maintain the data transferred to the registers during a reprogramming operation of the programmable logic device.

2. The programmable logic device of claim 1, further comprising user logic, wherein the user logic includes the logic blocks and memory blocks and is configured by configuration data stored in the configuration memory, wherein the routing resources are further adapted to provide a programmable data path between the user logic and the registers, and wherein the logic circuit is further adapted to control a transfer of data from any portion of the user logic to the registers via the routing resources to maintain the data transferred to the registers during a reprogramming operation of the programmable logic device.

3. The programmable logic device of claim 1, wherein the routing resources comprises common interface blocks, and wherein the logic circuit controls the registers to receive data from the common interface blocks prior to the reprogramming operation and to provide the data after the reprogramming operation.

4. The programmable logic device of claim 1, wherein the logic circuit is responsive to a latch enable signal and a program signal, the latch enable signal indicating whether the logic circuit should control the registers to store and maintain the data during the reprogramming operation, and the program signal indicating that a reprogramming operation has been commanded.

5. The programmable logic device of claim 4, wherein the latch enable signal is provided by a configuration memory cell of the configuration memory.

6. The programmable logic device of claim 4, wherein the logic circuit is responsive to a done signal, the done signal indicating to the logic circuit to maintain the data during the reprogramming operation, wherein the latch enable signal is provided by a configuration memory cell of the configuration memory.

7. The programmable logic device of claim 1, further comprising:
a volatile memory block adapted to receive and store data during operation of the programmable logic device;
input/output blocks adapted to transfer data into and out of the programmable logic device, wherein the logic circuit is further adapted to control a transfer of data from the volatile memory block and the input/output blocks to the registers via the routing resources to maintain the data transferred to the registers during a reprogramming operation of the programmable logic device; and
wherein the routing resources is further adapted to provide a programmable data path between the volatile memory block, the input/output blocks, the logic blocks, and the registers.

8. The programmable logic device of claim 1, wherein the logic circuit is further adapted to control a transfer of the data stored in the registers to the logic blocks upon completion of the reprogramming operation.

9. A method comprising:
programming routing resources between programmable logic and registers of a programmable logic device to provide a data path for data prior to a reprogramming;
transferring data from the programmable logic, prior to the reprogramming, to the registers via the data path to store the data within the programmable logic device during the reprogramming;
reprogramming the programmable logic device, wherein the reprogramming provides a reprogrammed data path between the programmable logic and the registers of the programmable logic device; and
transferring the data within the programmable logic device from the registers via the reprogrammed data path for use by the programmable logic after the reprogramming of the programmable logic device has been completed.

10. The method of claim 9, further comprising receiving by the programmable logic device a reprogram command, wherein the transferring of data from the programmable logic is performed in response to the reprogram command.

11. The method of claim 9, further comprising:
receiving by the programmable logic device a reprogram command; and
providing an internal latch enable signal and a done signal; wherein the transferring of data from the programmable logic is performed in response to the reprogram command and the latch enable signal, with the data maintained in the registers during the reprogramming in response to the done signal.

12. The method of claim 9, wherein the programmable logic comprises logic blocks and at least one memory block.

13. The method of claim 9, further comprising providing a reset signal to the registers, where the reset signal is separate from a global reset signal provided within the programmable logic device.

14. The method of claim 9, wherein the data path and the reprogrammed data path each comprises a parallel data path.

15. The method of claim 9, further comprising executing a programmable logic device design tool to generate configuration data for the reprogramming, wherein the configuration data comprises a latch enable bit for controlling the transferring of the data.

16. A computer-readable medium on which is stored a computer program for performing a method comprising:
generating configuration data for programming a programmable logic device;
setting a first bit of the configuration data, a value of the first bit providing a latch enable signal to control whether data will be transferred during a reprogramming operation of the programmable logic device to registers within the programmable logic device to maintain the data during the reprogramming operation; and
setting a second set of bits of the configuration data to provide a data path using routing resources between the registers and user logic within the programmable logic device after the reprogramming operation.

17. The method of claim 16, wherein the data path provides a plurality of parallel data paths.

18. The method of claim 16, wherein the programmable logic device provides a done signal to maintain the data stored in the registers during the reprogramming operation.

19. The method of claim 16, further comprising setting a third set of bits of the configuration data to program the user logic within the programmable logic device.

20. The method of claim 16, further comprising providing the configuration data via a configuration port of the programmable logic device.

* * * * *